United States Patent
Rogers

[11] Patent Number: 5,982,210
[45] Date of Patent: Nov. 9, 1999

[54] PLL SYSTEM CLOCK GENERATOR WITH INSTANTANEOUS CLOCK FREQUENCY SHIFTING

[75] Inventor: Alan C. Rogers, Palo Alto, Calif.

[73] Assignee: Sun Microsystems, Inc., Palo Alto, Calif.

[21] Appl. No.: 08/300,028

[22] Filed: Sep. 2, 1994

[51] Int. Cl.[6] .................................................. H03L 7/18
[52] U.S. Cl. ................................ 327/156; 327/117; 377/47
[58] Field of Search ................................ 327/144, 146, 327/147, 156, 233, 243, 244, 295, 297, 117; 331/17, 25; 375/120; 377/47, 48

[56] References Cited

U.S. PATENT DOCUMENTS

| | | | |
|---|---|---|---|
| 3,898,579 | 8/1975 | Aldridge | 327/156 |
| 4,043,438 | 8/1977 | Avant | 327/156 |
| 4,357,527 | 11/1982 | Kojima | 377/48 |
| 4,489,287 | 12/1984 | Nagumo et al. | 327/156 |
| 4,633,194 | 12/1986 | Kikuchi et al. | 377/47 |
| 4,668,922 | 5/1987 | Crawford et al. | 327/156 |
| 4,829,258 | 5/1989 | Volk et al. | 327/156 |
| 4,965,531 | 10/1990 | Riley | 377/48 |
| 5,052,031 | 9/1991 | Molloy | 327/117 |
| 5,133,064 | 7/1992 | Hotta et al. | 327/156 |
| 5,202,906 | 4/1993 | Saito et al. . | |

Primary Examiner—Timothy P. Callahan
Assistant Examiner—Eunja Shin
Attorney, Agent, or Firm—B. Noel Kivlin

[57] ABSTRACT

The present invention provides a phase locked loop (PLL) clock generator for a digital system. The PLL clock generator is capable of an instantaneous transition between a high frequency and a low frequency, corresponding to an active mode and a slow mode, and vice versa The PLL clock generator includes a phase locking circuit, a frequency changer coupled to the output of the phase locking circuit, and a frequency controller coupled to the frequency changer. The frequency changer is capable of instantaneously changing the frequency of a first clock signal received from the phase locking circuit. The frequency controller is responsible for controlling the frequency at the output of the frequency changer. The frequency controller is responsive to a control signal which is used to transition the PLL clock generator from an active mode to a slow mode and vice versa In one embodiment, the phase locking circuit generates the first clock signal in response to a reference clock signal and a feedback clock signal. The frequency changer includes a first divider for generating a global clock signal in response to the first clock signal, and a second divider for generating a peripheral clock signal and a feedback signal in response to the global clock signal The frequency controller, responsive to the control signal is used to change the divisors of the first and second dividers simultaneously, thus instantaneously transitioning the PLL circuit between the active mode and slow mode.

19 Claims, 6 Drawing Sheets

PLL SYSTEM CLOCK GENERATOR WITH INSTANTANEOUS CLOCK FREQUENCY SHIFTING

BACKGROUND OF THE INVENTION

1. Field of the Invention

This invention relates to digital circuits and in particular, to a phase locked loop (PLL) clock generator with instantaneous frequency shifting capability.

2. Description of the Related Art

Conventional digital systems, such as a digital computer system, use a system clock to synchronize a number of subsystems or components. A typical digital computer system includes a number of subsystems such as a central processing unit (CPU), a random access memory (RAM) and an input/output (I/O) control circuit for controlling peripheral devices such as printers and floppy drives. A system clock generator, typically located near the CPU, generates a global or master clock signal from which multiple synchronous system clock signals are derived. These system clock signals are provided to their respective subsystems, e.g., to the CPU and to the RAM. The system clock generator also provides a peripheral clock signal for driving the I/O control circuit.

With high frequency CPUs (greater than 10 megahertz), a PLL system clock generator is preferably used. As the clock frequency of digital systems approach about 100 megahertz (MHz), the use of a PLL type clock generator or an equivalent which utilizes feedback from the global system clock becomes mandatory for maintaining reliable subsystem synchronization.

FIG. 1 is block diagram showing a conventional PLL clock generator 100. Clock generator 100 includes a phase locking circuit 110, a first divider 120 and a plurality of output buffers 131, 132, . . . 139. Phase locking circuit 110 includes an input node 111 for receiving a variable reference clock signal RCLK, a second input node 112 for receiving a feedback clock signal FBCLK, and an output node 115 for providing a PLL clock signal PLLCLK. Output node 115 of phase locking circuit 110 is coupled to an input node 121 of a first divider 120. In turn, an output node 125 of first divider 120 provides a global clock signal GCLK to the respective input nodes of output buffers 131, 132, . . . 139.

Phase locking circuit 110 can be one of a number of prior art circuits commonly used for PLLs. Clock generator 100 operates by maintaining reference clock signal RCLK and FBCLK at the same frequency and phase. Phase locking circuit 110 compares feedback clock signal FBCLK to reference clock signal RCLK and adjusts PLL clock signal PLLCLK to compensate for any variations in phase and/or frequency between reference clock RCLK signal and feedback clock signal FBCLK, thereby maintaining PLL clock signal PLLCLK in synchronization with reference clock signal RCLK.

The frequency of global clock signal GCLK of a typical computer system is fairly high and not always suitable for directly driving any I/O control circuitry. As such, the frequency of peripheral clock signal PCLK can be is substantially lower than that of global clock signal GCLK A lower frequency peripheral clock signal PCLK is generated by inserting a second divider 140 between output node 125 of first divider 120 and input node 112 of phase locking circuit 110. Second divider 140 generates peripheral clock signal PCLK for driving the I/O control circuit and provides feedback clock signal FBCLK to phase locking circuit 110.

In other words, global clock signal GCLK drives the fast subsystems of the computer system, while the slower peripheral clock signal PCLK drives the I/O control circuit and provides feedback clock signal FBCLK.

With the advent of high speed computer systems, it is increasingly important for the computer system to be able to rapidly, preferably within one clock cycle, reduce the frequency of global clock signal GCLK, i.e., enter a slow mode, whenever optimal performance is not required. Lower power consumption and heat generation are reduced significantly when the computer system is in the slow mode. Similarly, it is important to be able to quickly return global clock signal GCLK to its original high frequency, preferably within one clock cycle, when optimal performance is needed again. When the computer system is a high speed portable system, this need to minimize power consumption is even more crucial because of the desire to extend the operating range of a portable computer system's on-board battery.

One major problem with prior art clock generator 100 is caused by the need for clock generator 100 to change the frequency of reference clock signal RCLK in order to change global clock signal GCLK. Changing the frequency of reference clock signal RCLK results in prior art clock generator 100 requiring a lag time to resynchronize to the new frequency of reference clock signal RCLK before global clock signal GCLK and hence system clock signals SCLK(1), SCLK(2), . . . SCLK(n) are sufficiently stable to be relied upon by the respective subsystems of the computer system. Typically, a lag time period of over 1000 clock cycles is required for clock signals PCLK, SCLK(1), SCLK(2), . . . SCLK(n) to re-stabilize. Note that during these relatively long transition periods, the frequency of system clock signals are indeterminate and cannot be depended on. As such, the computer system is idle while the clock signals PCLK, SCLK(1), SCLK(2), . . . SCLK(n) are stabilizing and is unable to perform any useful functions during these lag periods.

SUMMARY OF THE INVENTION

The present invention relates to a high speed system clock generator capable of changing the frequency of its output signal instantaneously when transitioning between different clock speeds. The system clock generator enables high speed computer systems to execute fast transitions between high and low clock speeds thereby minimizing power consumption and reducing heat production, thereby reducing cooling requirements, e.g., cooling fans, without compromising transitional performance.

The present invention provides a phase locked loop (PLL) clock generator capable of an instantaneous transition between a high frequency and a low frequency, and vice versa. The PLL clock generator includes a phase locking circuit, a frequency changer coupled to the output of the phase locking circuit, and a frequency controller coupled to the frequency changer. The frequency changer is capable of instantaneously changing the frequency of a first clock signal received from the phase locking circuit. The frequency controller is responsible for controlling the frequency output of the frequency changer. The frequency controller is responsive to a control signal which is used to transition the PLL clock generator from an active mode to a slow mode to idle operation and vice versa. In one embodiment, the frequency changer includes a first divider for generating a global clock signal and a second generator for generating a peripheral clock signal. The frequency controller, responsive to the control signal is used to change the divisors of the first and second dividers, thus instantaneously transitioning the PLL circuit between the active mode and slow mode.

During normal operation, i.e., active mode, the phase locking circuit generates the first clock signal in response to a reference clock signal and a feedback clock signal. The first divider receives the first clock signal and generates the global clock signal by dividing the first clock signal. In turn, the second divider receives the global clock signal and generates the feedback clock signal and peripheral clock signal by dividing the global clock signal. As discussed above, both first and second divider perform their respective divisions under the control of the frequency controller, i.e., their respective divisors are determined by the frequency controller.

In accordance with one aspect of the invention, the respective divisors of the first and second dividers are changed simultaneously, thereby changing the frequency of the global clock signal while maintaining the feedback clock signal at a constant frequency. As a result, the input signals of the phase locking circuit, the reference clock signal and the feedback clock signal, are not subjected to any sudden changes in frequencies, i.e., phase locking circuit does not experience the sudden input frequency changes normally associated with the prior art method of changing the reference clock signal and/or the feedback clock signal.

The incorporation of the PLL clock generator of the present invention in a host computer system has a number of advantages over the prior art. By enabling the host computer system to complete transitions from the slow mode to the active mode instantaneously, no lag time is expended waiting for the first clock signal generated by the phase locking circuit to stabilize. As a result, the host computer system is able to conserve power and minimize heat generation without compromising performance or functionality. This aspect of the invention results in increased reliability and reduced power consumption for the host computer system. In portable host computer systems, this aspect also translates into increased battery life and extended operating range.

DESCRIPTION OF THE DRAWINGS

The objects, features and advantages of the system of the present invention will be apparent from the following description in which.

DESCRIPTION OF THE PREFERRED EMBODIMENT

Figure 1:
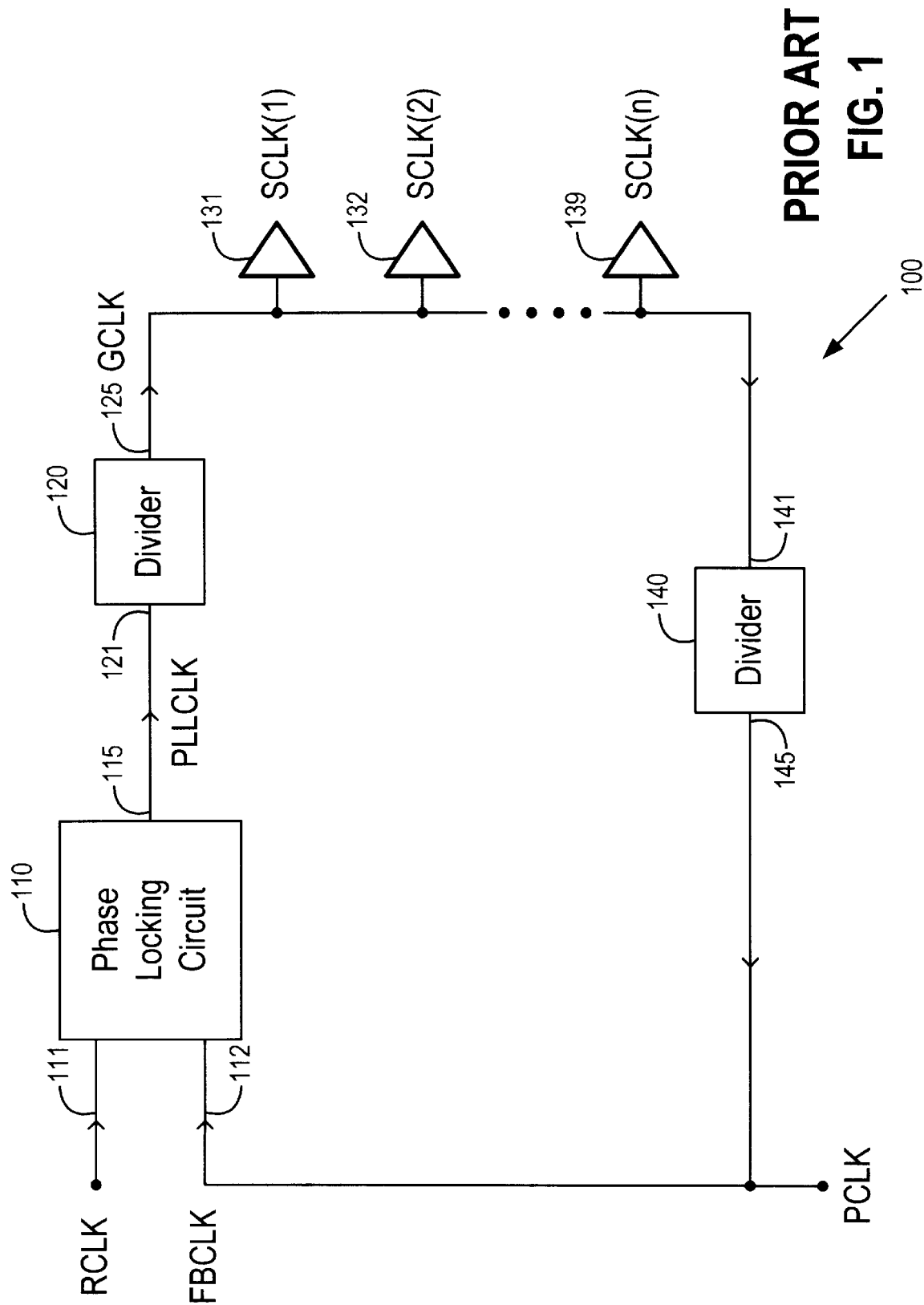
FIG. 1 illustrates a conventional phase locked loop (PLL) clock generator.
Figure 2:
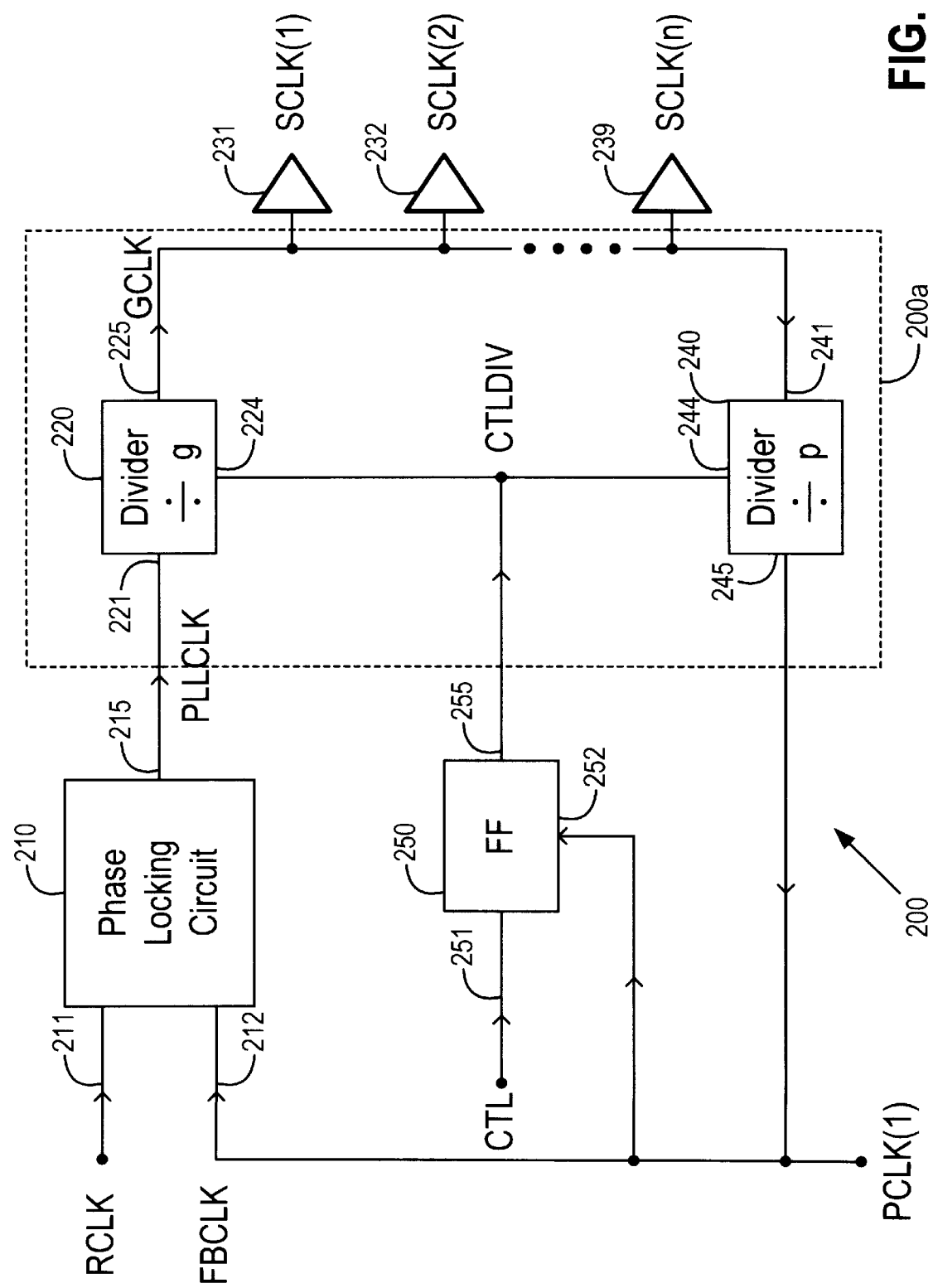
FIG. 2 is a block diagram illustrating a PLL clock generator capable of instantaneous frequency shift in accordance with the invention.

FIG. 2 is a block diagram showing one embodiment of a phase locked loop (PLL) clock generator 200 for a host computer in accordance with the invention. Clock generator 200 includes a phase locking circuit 210, a frequency changer 200a, a plurality of output buffers 231, 232, ... 239, and a frequency controller 250. In this embodiment, frequency changer 200a includes a first divider 220 and a second divider 240, and frequency controller 250 includes a flip-flop. Phase locking circuit 210 includes an input node 211 for receiving an external reference signal RCLK, a second input node 212 for receiving feedback clock signal FBCLK, and an output node 215 for providing PLL clock signal PLLCLK. Output node 215 of phase locking circuit 210 is coupled to an input node 221 of first divider 220. Output node 225 of first divider 220 is coupled to a plurality of output buffers 231, 232, . . . 239 which generate system clock signals SCLK(1), SCLK(2), . . . SCLK(n), respectively. Output node 225 of first divider 220 is also coupled to an input node 241 of second divider 240. Second divider 240 provides a peripheral clock signal PCLK at an output node 245 which is presented as feedback clock signal FBCLK to feedback node 212 of phase locking circuit 210. A first peripheral clock signal PCLK(1) is also provided to an input clock node 252 of frequency controller 250. A control signal CTL is presented at an input control node 251 of frequency controller 250. An output node 255 of frequency controller 250 is coupled to control nodes 224, 244 of dividers 220, 240, respectively.

Reference clock signal RCLK presented to phase locking circuit 210 can be generated by a number of well known circuits familiar to one skilled in the art, such as a crystal oscillator circuit. In accordance to one aspect of the invention, reference clock signal RCLK remains at a stable constant frequency. In other words, clock generator 200 does not need to change the frequency of reference clock signal RCLK in order to change the frequency of system clock signals SCLK(1), SCLK(2), . . . SCLK(n).

Phase locking circuit 210 can be one of a number of well known circuits commonly used for PLLs. The primary function of phase locking circuit 210 is to synchronize reference clock signal RCLK to feedback clock signal FBCLK. Feedback clock signal FBCLK is generated by a feedback control loop formed by phase locking circuit 210 and frequency changer 200a Phase locking circuit 210 accomplishes synchronization by comparing feedback clock signal FBCLK to reference clock signal RCLK and making appropriate adjustments to PLL clock signal PLLCLK generated at output node 215, to compensate for any detectable variations in phase and/or frequency between reference clock RCLK signal and feedback clock signal FBCLK which is derived from global clock signal GCLK.

Phase locking circuit 210 provides PLL clock signal PLLCLK to first divider 220 having an adjustable divisor value of "g". In sum, first divider 220 provides global clock signal GCLK via output node 225 to the respective input nodes of a plurality of buffers 231, 232, . . . 239 which provide system clock signals SCLK(1), SCLK(2), . . . SCLK(n), respectively. The output signal from first divider 220 is also provided to input node 241 of second divider 240 which has an adjustable divisor value of "p". Second divider 340 produces first peripheral clock signal PCLK(1) at output node 245, typically with a lower frequency than global clock signal GCLK, for driving the I/O control circuit. In this implementation, peripheral clock signal PCLK(1) also provides feedback clock signal FBCLK to input node 212 of phase locking circuit 210, thereby completing the feedback control loop for clock generator 200.

In this embodiment, reference clock signal RCLK and feedback clock signal FBCLK are maintained at the same frequency and phase. However, in accordance to the principles of the present invention, reference clock signal RCLK and feedback clock signal FBCLK need only be synchronous and not necessarily identical. For example, it is possible for the frequency of reference clock signal RCLK to be a multiple of that of feedback clock signal FBCLK, provided that both clock signals RCLK and FBCLK are synchronous; compensation between clock signals FBCLK and RCLK being provided by phase locking circuit 210.

Since PLL clock signal PLLCLK and hence feedback clock signal FBCLK are maintained at their respective constant frequencies, while global clock signal GCLK alternates between the high and low frequencies, the numerical values of divisors "g" and "p" are dependent on each other. However, divisors "g" and "p" are not constant values in that for each particular pair of desired high and low frequencies for global clock signal GCLK, there exists two pairs of appropriate dependent divisor values. Exemplary numerical values are provided in a description below.

Further, the respective divisors of dividers 220 and 240, may include numerical values greater than one, equal to one and less than one. As is well known to one skilled in the art, if the divisor of a frequency divider is greater than one, the output frequency produced by the frequency divider, e.g., divider 220 or 240, will be lower than the input frequency. Conversely, if the divisor of the frequency divider is less than one, the output frequency produced by the frequency divider will be greater than the input frequency, i.e., the frequency divider will function as a frequency multiplier.

As described above, peripheral clock signal PCLK(1) is also provided as feedback clock signal FBCLK to frequency controller 250. In addition, input node 251 of frequency controller 250 is coupled to a control signal CTL. When the host computer system is powered on or undergoes a hard reset, clock generator 300 is also reset. Since frequency controller 250 is responsible for controlling the mode of clock generator 200, i.e., active (high frequency) or sleep (low frequency) mode, control signal CTL is logically dependent on the following conditions; (i) a system reset (RESET), (ii) CPU not being busy (CPU_NOT_BUSY), and (iii) the system bus not being valid (BUS_NOT_VALID). A suitable logical equation is described below:

CTL=RESET+CPU_NOT_BUSY & BUS_NOT_VALID

In one embodiment, when the computer system is in the active mode, external control signal CTL is asserted "LOW" causing frequency controller 250 to assume a first state corresponding to the active mode. In this example, reference clock signal is at a constant 40 MHz. Phase locking circuit 210 produces PLL frequency of 160 Mhz. The divisor "g" of first divider 220 is set to 2. First divider receives PLL clock signal PLLCLK at input node 321 and produces a global clock signal GCLK of 80 MHz for driving buffers 231, 232, . . . 239. The divisor "p" of second divider 240 is set to 2, thereby further reducing the 80 MHz frequency of clock signal GCLK at input node 241 of second divider 240 to produce a peripheral clock signal PCLK(1) of 40 MHz. As a result, the frequencies of global clock signal GCLK and peripheral clock signal PCLK(1) are at 80 MHz and 40 MHz, respectively. Feedback clock signal FBCLK is derived directly from peripheral clock signal PCLK(1) and hence has a frequency of 40 MHz.

Conversely, when the computer system is in the slow mode, a low system clock frequency is desirable to conserve power and reduce heat generation. Control signal CTL is asserted "HIGH" causing frequency controller 250 to assume a second state corresponding to the slow mode. In turn, first and second dividers 220, 240 change their divisors to 4 and 1, respectively. First divider 220 receives the 160 MHz PLL clock signal PLLCLK at input node 221 and produces a global clock signal GCLK having a frequency of 40 MHz, which is provided to output buffers 231, 232, . . . 239. Second divider 240 is now a null divider and simply produces a peripheral clock signal PCLK(1) having a frequency of 40 MHz at output node 245. Note that in either modes, both peripheral clock signal PCLK(1) and feedback clock signal FBCLK remains at a constant frequency, i.e., 40 MHz in this example.

Although numeric values are assigned to the frequencies of the various clock signals RCLK, GCLK, PCLK(1), FBCLK and to the respective divisors of dividers 220, 240 to illustrate the operation of clock generator 200, one skilled in the art will be able to apply the principles of the present invention to other sets of numeric values. In addition, modifications to the described embodiment of clock generator 200 are also possible without deviating from the spirit of the invention.

As discussed above, the frequencies of the clock signals at input nodes 211, 212 of phase locking circuit 210 are maintained at a constant level regardless of the modes, including the crucial transition time period(s) occurring between the active and slow modes of the computer system. When dividers 220, 240 simultaneously switch their respective divisors under the control of frequency controller 250, global clock signal GCLK switches between the fast and slow frequencies without causing any change in the frequency of feedback clock signal FBCLK Consequently, no change in the frequency of reference clock signal RCLK is required. As a result, phase locking circuit 210 is not constantly subjected to abrupt changes in frequencies which would otherwise demand lag time periods before global clock signal GCLK is stable enough to be reliable.

The inherent continuous stability provided to clock generator 200 by constant frequency of clock signals RCLK and FBCLK advantageously allows the computer system to rapidly (within one half clock cycle of reference clock signal RCLK) switch between active and slow modes. Hence, clock generator 200 of the present invention operate without the lag time penalties normally associated with the settling time periods of conventional PLL generators such as clock generator 100.

Figure 3A:
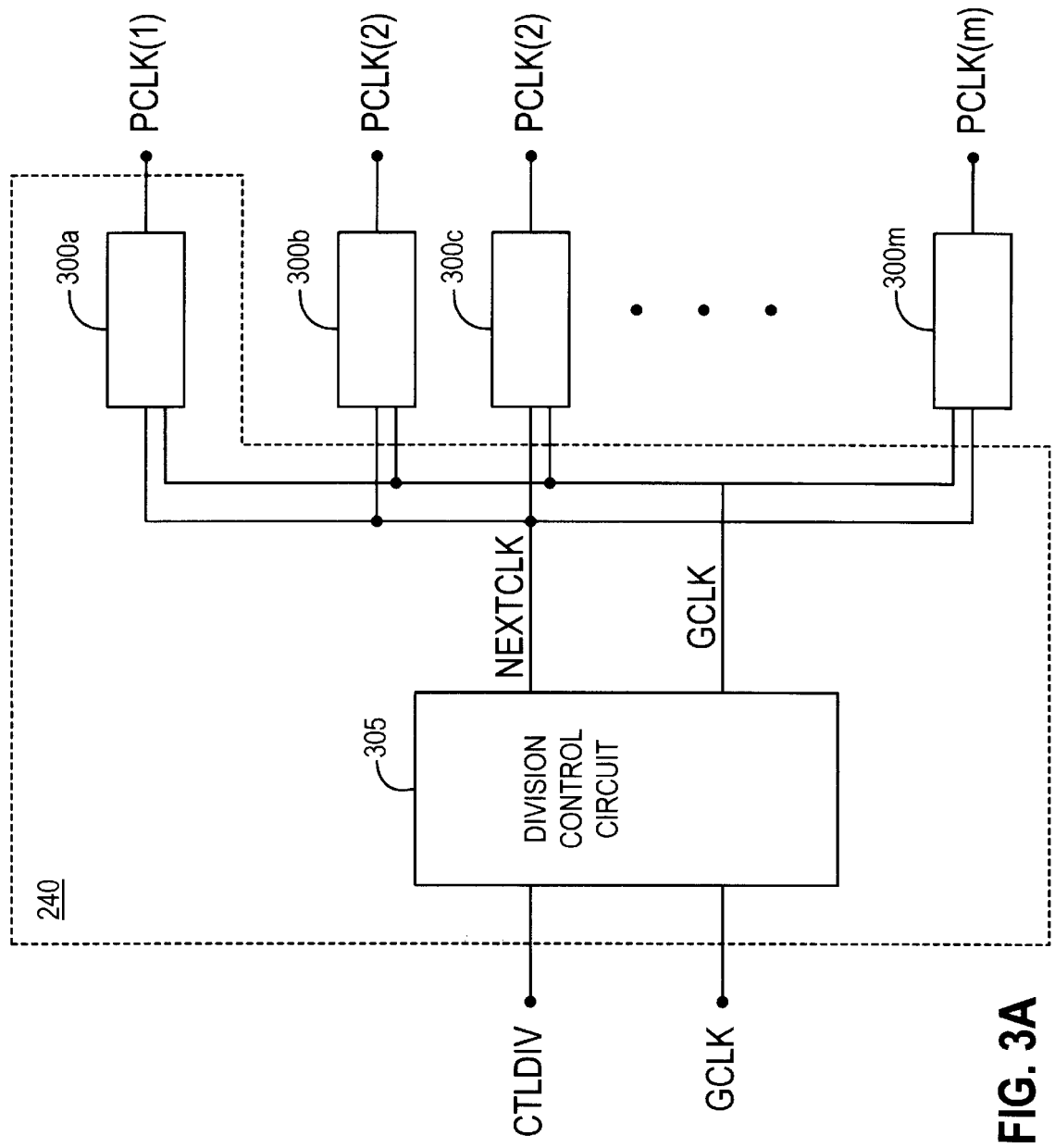
FIG. 3A is a block diagram illustrating a divider of FIG. 2.

FIG. 3A is a logic diagram illustrating divider 240 of clock generator 200 in accordance with one embodiment of the present invention. Divider 240 includes a division control circuit 305 and a dual-edge flip-flop 300a. Division control circuit 305 provides a control signal NEXTCLK and clock signal GCLK to flip-flop 300a. In turn flip-flop 300a produces first peripheral clock signal PCLK(1). Note that additional peripheral clock signals PCLK(2), PCLK(3), . . . PCLK(m) can be provided by simply including additional dual-edge flip-flops 300b, 300c . . . 300m, which are distributed around the periphery of clock generator 200 and are coupled to division control circuit 305.

Figure 3B:
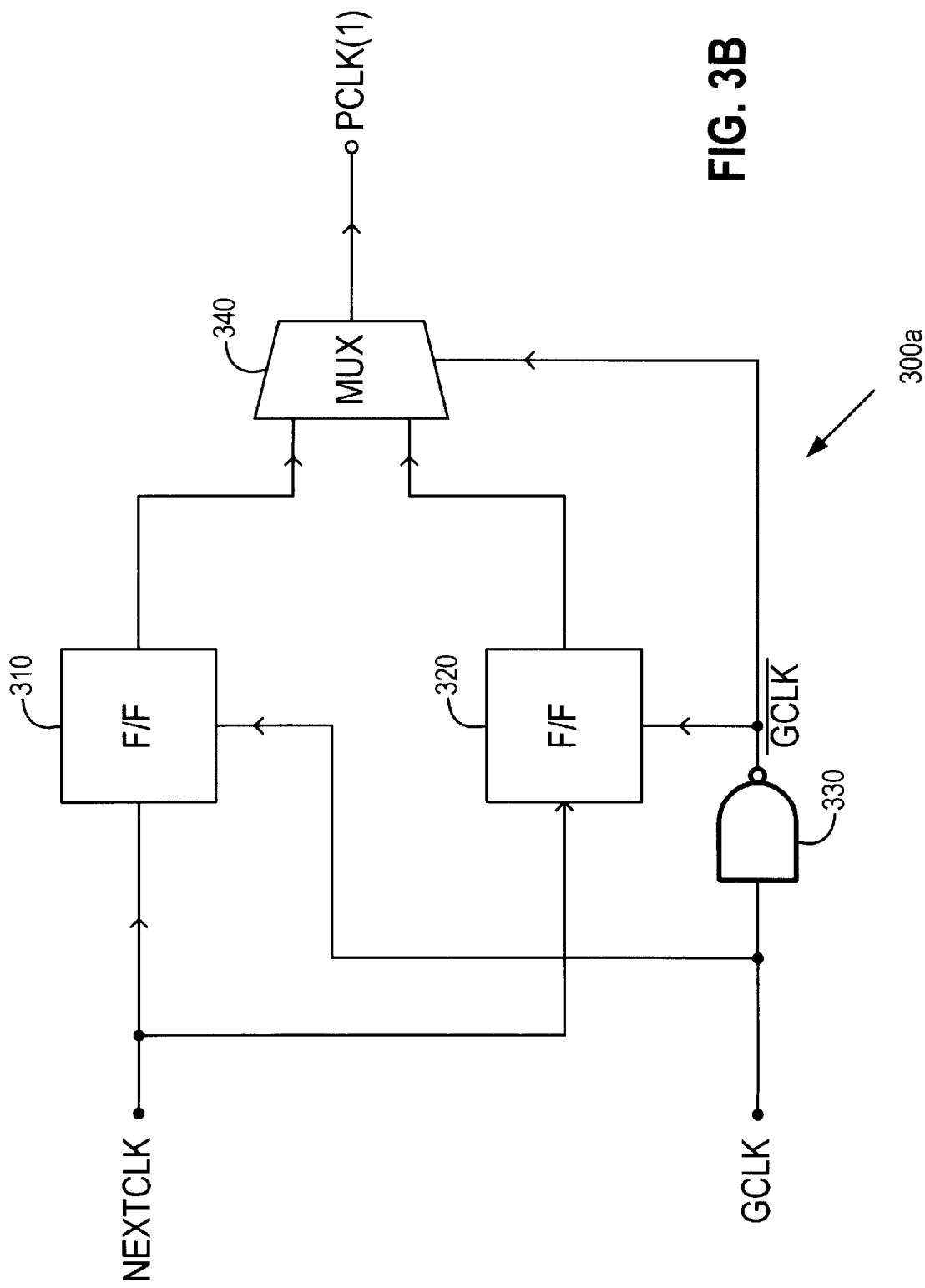
FIG. 3B is a block diagram of a dual-edge flip-flop for the divider of FIG. 3A.

FIG. 3B is a block diagram of dual-edge flip-flop 300a which includes two flop-flops (F/Fs) 310, 320, an inverter 330 and a multiplexer 340. The "D" inputs of FFs 310, 320 are coupled to control signal NEXTCLK. The "CLK" input of F/F 310 is coupled to a global clock signal GCLK, and the "CLK" input of F/F 320 is coupled to a complementary global signal $\overline{GCLK}$ provided at the output node of inverter 330. In turn, the output nodes of F/Fs 310, 320 are coupled to the inputs of a multiplexer (MUX) 340.

As is apparent to one skilled in the art, the embodiment of divider 240 illustrated by FIGS. 3A and 3B is merely illustrative. Many variations and modifications to divider 240 are possible without deviating from the present invention. For example, circuitry for generating control signal CTL, used for determining the states of dividers 220 and 240, can either be external (remote) or internal to clock generator 200.

Clock signals GCLK and $\overline{\text{GCLK}}$ control the opposing phases of output clock signal PCLK(1). Synchronization of the various clock signals of the computer system is necessary to ensure the proper interaction between the various subsystems, especially at high frequencies. Note that divider 220 of clock generator 200 can also be implemented using the same logic circuit of FIG. 3.

Figure 4:
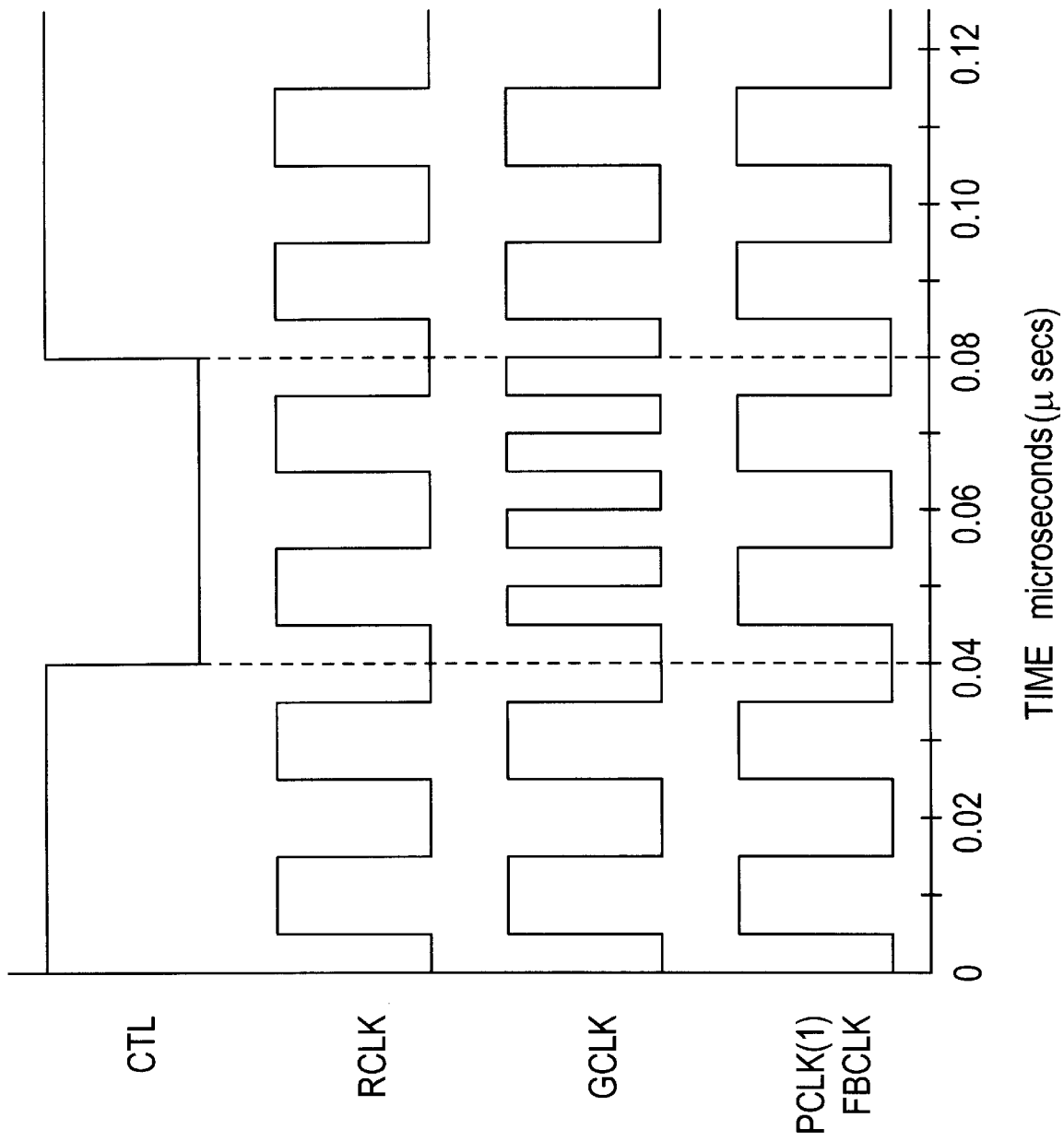
FIG. 4 is a timing diagram showing the various clock signals of the clock generator of FIG. 2.

Referring to the timing diagram of FIG. 4 which illustrates the various clock signals as clock generator 200 alternates between the active and slow modes. In this implementation, reference clock signal RCLK and feedback clock signal FBCLK are maintained at identical frequencies while global clock signal GCLK alternates between a predefined high frequency and a predefined low frequency corresponding to the active and slow modes of clock generator 300. For example, clock generator 200 is at the low frequency (slow mode) when time (t) is less than 0.04 microseconds ($\mu$secs) and again when t is greater than 0.08 $\mu$sec. Conversely, clock generator 200 is at the high frequency (active mode) when t is between 0.04 and 0.08 $\mu$sec. Reference clock signal RCLK and feedback clock signal FBCLK are maintained at a constant frequency of 40 megahertz (MHz) regardless of the modes. In addition, phase locking circuit 310 produces a constant PLL clock frequency of 160 MHz.

When control signal CTL is deasserted, e.g., at time (t) equal to 0.04 $\mu$sec, global clock signal GCLK completes a transition from the slow frequency to the fast frequency before the next rising edge of reference clock signal RCLK. The first falling edge of global clock signal GCLK resulting from the transition occurs at (t) equal to 0.05 $\mu$sec.

Conversely, when control signal CTL is reasserted, e.g., at (t) equal to 0.08 $\mu$sec, global clock signal GCLK completes a transition from the high frequency to the low frequency before the next rising edge of reference clock signal RCLK. The first falling edge of global clock signal GCLK resulting from the transition occurs at t equal to 0.095 $\mu$sec. Hence, both transitions described above complete well within one half of one clock cycle or 0.05 $\mu$secs of reference clock signal RCLK Note that the timing diagram is only exemplary and illustrative of the principles of the invention.

Since clock generator 200 is able to execute instantaneous (transparent) transitions between the active and slow modes, a very large number of transitions can be performed without degrading the performance of the host computer system. Various stimuli can be used to trigger the computer system into entering the slow mode. For example, inactivity of a user at a keyboard of the computer system or when software operating on the computer system is "looping" and waiting for an interrupt are examples of stimuli for entering the slow mode. Conversely, when the user resumes typing on the keyboard or when the software begins executing "useful" code, the computer system is reawaken and instantaneously enters the active mode.

Figure 5:
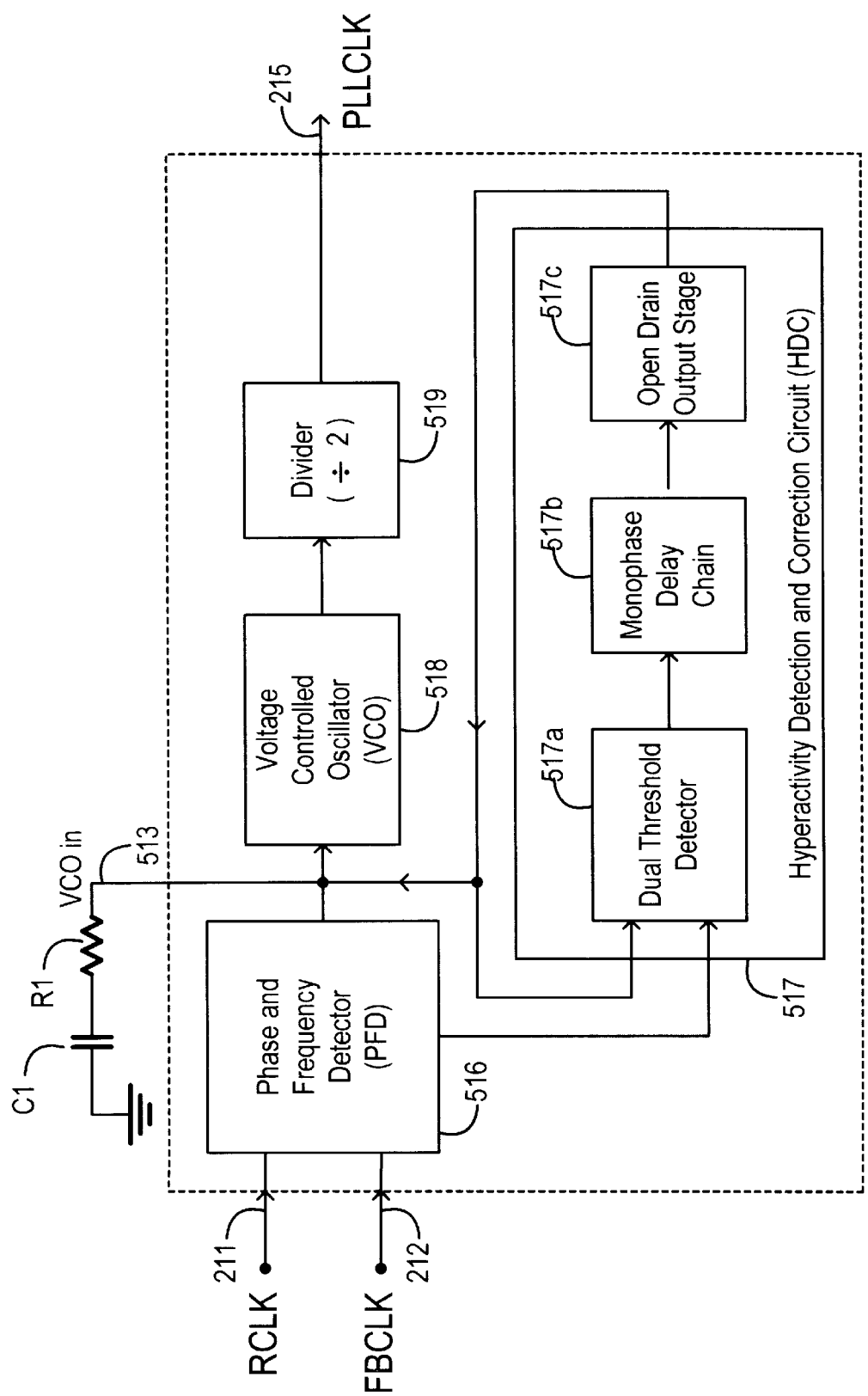
FIG. 5 is a detailed block diagram of one embodiment of the phase locking circuit of FIG. 2.

In the preferred embodiment, as shown in the block diagram of FIG. 5, phase locking circuit 210 includes a phase and frequency detector (PFD) 516, a hyperactivity detection and correction (HDC) circuit 517, voltage controlled oscillator (VCO) 518 and divider 519. Phase locking circuit 210 is also coupled to an external pair of resistor R1 and capacitor C1 which control the frequency(s) of clock generator 200. HDC circuit 517 has a dual threshold detector 517a, a monophase delay chain 517b and an open drain output stage 517c. For detailed information, see U.S. Pat. No. 5,220,293, assigned Sun Microsystems, Inc., herein incorporated by reference.

In sum, the present invention provides an efficient mechanism for the computer system to execute fast transitions between the active and slow modes, thereby increasing battery life and reducing heat generation. The result is a computer system with increased reliability and reduced power consumption, and without any reduction in speed or functionality. Other modifications and additions are possible. For instance, in some embodiments, the computer system includes sensors for detecting overheating or low battery power and automatically trigger the computer system into entering a slow mode.

What is claimed is:

1. A phase locked loop clock generator comprising:
    a phase locking circuit for generating a first clock signal in response to a reference clock signal and a feedback clock signal; and
    a frequency changer for generating a global clock signal for said phase locked loop clock generator and said feedback clock signal in response to said first clock signal, said frequency changer changing the frequency of said global clock signal in response to a control signal, with said reference clock signal and feedback clock signal being maintained at a first and second constant frequency, respectively.

2. The clock generator of claim 1 wherein said frequency changer includes a first divider for dividing said first clock signal to produce said global clock signal, and a second divider coupled to said first divider for dividing said global clock signal to produce said feedback clock signal.

3. The clock generator of claim 2 further comprising a frequency controller coupled to said first and second dividers for simultaneously changing the respective divisors of said first and second dividers.

4. The clock generator of claim 1 wherein said frequency changer also provides a peripheral clock signal.

5. A phase locked loop feedback circuit useful in association with a system clock generator, said feedback circuit comprising a frequency changer for generating a global clock signal for said system clock generator and a feedback clock signal in response to a first clock signal said frequency changer changing the frequency of said global clock signal in response to a control signal, a reference clock signal and said feedback clock signal being maintained at a first and second constant frequency, respectively.

6. The feedback circuit of claim 5 wherein said frequency changer includes a first divider for dividing said first clock signal to produce said global clock signal, and a second divider coupled to said first divider for dividing said global clock signal to produce said feedback clock signal.

7. The feedback circuit of claim 6 further comprising a frequency controller coupled to said first and second dividers for simultaneously changing the respective divisors of said first and second dividers.

8. A method for generating a global clock signal comprising the steps of:
    generating a first clock signal in response to a reference clock signal and a feedback clock signal; and
    generating said global clock signal and said feedback clock signal in response to said first clock signal, said frequency of said global clock signal changing in response to an external control signal, with said reference clock signal and said feedback clock signal being maintained at a first and second constant frequency, respectively.

9. The method of claim 8 wherein the step of generating said global clock signal includes the step of dividing a first clock signal to produce a global clock signal.

10. The method of claim 9 wherein the step of generating said feedback signal includes the step of dividing said global clock signal to produce said feedback clock signal.

11. The method of claim 10 further comprising the step of changing the respective divisors of a first and second divider to change the frequency of said global clock signal.

12. The method of claim 8 wherein the step of generating said feedback signal includes the step of providing a peripheral clock signal.

13. A method for changing the frequency of a global clock signal generated by a phase locked loop generator having a first and second divider coupled in series, said method comprising the steps of:

changing the divisor of said first divider to change said frequency of said global clock signal produced at an output node of said first divider; and simultaneously changing the divisor of said second divider to maintain a feedback clock signal produced at an output node of said second divider at a first constant frequency, with a reference clock signal provided to said generator being maintained at a second constant frequency.

14. The method of claim 13 wherein the step of generating said global clock signal includes the step of dividing a first clock signal to produce a global clock signal.

15. The method of claim 14 wherein the step of generating said feed back signal includes the step of dividing said global clock signal to produce said feedback clock signal.

16. The method of claim 15 further comprising the step of changing the respective divisors of said first and second dividers to change the frequency of said global clock signal.

17. A method of using a phase locked loop circuit to produce a global clock signal having an instantaneously changing frequency, said method comprising the steps of:

comparing an input clock signal with a PLL feedback signal;

generating a first clock signal in response to said comparing step;

dividing said first clock signal to produce said global clock signal;

dividing said global clock signal to produce said PLL feedback signal;

changing the divisor of said first dividing step to instantaneously change the frequency of said global clock signal; and simultaneously changing the divisor of said second dividing step to maintain said PLL feedback signal at a first constant frequency, with said input clock signal provided to said generator being maintained at a second constant frequency.

18. The phase locked loop clock generator of claim 1 wherein said first and second constant frequencies are the same.

19. The method of claim 8 wherein said first and second constant frequencies are the same.

* * * * *

UNITED STATES PATENT AND TRADEMARK OFFICE
CERTIFICATE OF CORRECTION

PATENT NO. : 5,982,210
DATED : November 9, 1999
INVENTOR(S) : Alan C. Rogers

It is certified that error appears in the above-identified patent and that said Letters Patent is hereby corrected as shown below:

Claim 5, col. 8, line 45, please insert --with-- after "signal,".

Signed and Sealed this

Thirtieth Day of May, 2000

Attest:

Q. TODD DICKINSON

Attesting Officer

Director of Patents and Trademarks